United States Patent
Huang

(10) Patent No.: US 6,334,574 B1
(45) Date of Patent: Jan. 1, 2002

(54) IDENTIFICATION DEVICE FOR IC LOADING TRAY

(76) Inventor: Teung-Lin Huang, No.97, Hsyeh Kuan Road, Jen Wu Hsiang, Kaohsiung Hsien (TW)

( * ) Notice: Subject to any disclaimer, the term of this patent is extended or adjusted under 35 U.S.C. 154(b) by 0 days.

(21) Appl. No.: 09/678,786

(22) Filed: Oct. 4, 2000

(51) Int. Cl.[7] .................................................. G06K 7/00
(52) U.S. Cl. ........................ 235/486; 235/492; 235/379
(58) Field of Search ................................. 235/486, 492, 235/379, 383, 385; 902/13, 14

(56) References Cited

U.S. PATENT DOCUMENTS

| | | | |
|---|---|---|---|
| 3,696,538 A | * 10/1972 | Nast | 40/104.18 |
| 5,979,756 A | * 11/1999 | Ahn et al. | 235/383 |
| 6,070,731 A | * 6/2000 | Kobayashi et al. | 206/722 |
| 6,216,948 B1 | * 4/2001 | Conboy | 235/383 |

FOREIGN PATENT DOCUMENTS

| | | | |
|---|---|---|---|
| GB | 2303250 A | * | 12/1997 |
| JP | 9188383 A | * | 7/1997 |
| WO | WO-9009849 | * | 9/1990 |

* cited by examiner

*Primary Examiner*—Michael G. Lee
*Assistant Examiner*—Uyen-Chau N. Le
(74) *Attorney, Agent, or Firm*—Rosenberg, Klein & Bilker

(57) ABSTRACT

The present invention relates to an identification device for IC (Integrated Circuit) loading tray, and in particular, to an identification card mounted to protruded edges provided alternatively at the side of the IC loading tray. The identification device employs words, colors or the combination thereof or other methods to identify the marking/indication of IC specification so as to facilitate the identification of the IC loading tray. The identification device can be easily operated and will not be dislocated therefrom.

5 Claims, 4 Drawing Sheets

IDENTIFICATION DEVICE FOR IC LOADING TRAY

BACKGROUND OF THE INVENTION (a) Technical Field of the Invention

The present invention relates to an identification device for IC (Integrated Circuit) loading tray, and in particular, to an identification card mounted to protruded edges provided alternatively at the side of the IC loading tray. The identification device employs words, colors or the combination thereof or other methods to identify the marking/indication of IC specification so as to facilitate the identification of the IC loading tray. The identification device can be easily operated and will not be dislocated therefrom.

(b) Description of the Prior Art

For IC manufacturers, the delivery and/or shipping of ICs are mostly made use of IC packaging belt or IC loading tray, for instance, the IC loading tray as shown in FIG. 1. Referring to FIG. 1, the loading tray is substantially rectangular body having two corresponding edges, a top and a bottom protruded edge 11, 12 which are alternatively arranged thereon. The surrounding of the top end of the IC loading tray 1 is provided with a protruded circular edge 13, and the interior of the circular edge 13 is a depressed tray surface 14. A plurality of rows of loading holes 15 are provided on the tray surface 14 for the positioning of the IC finished product so as to attain the objective of holding the ICs in place.

The size of the IC loading tray is made to comply with the specification set forth by Electronic Industries Association. The IC loading tray 1 used globally are of the same size but the size of the loading holes 15 of the tray surface 14 are different in order to hold IC with various sizes. The IC manufacturers stack all the IC loading trays 1 (as shown in FIG. 2) to facilitate shipping and delivery. Due to the fact that the IC loading trays look alike in appearance, the IC specification on the loading trays cannot be known based on the tray surface 14. As a result, a label 2 has to be made at one lateral side of the loading tray 1. One drawback of such label 2 is that the label 2 may be dislocated in the process of shipping and delivery of ICs.

Therefore, it is an object of the present invention to provide an identification device for IC loading tray which mitigates the above drawback.

SUMMARY OF THE INVENTION

Accordingly, it is an object of the present invention to provide an identification device for IC loading tray, wherein the protruded edges at the side of the IC loading tray is mounted with an identification card which employs words, colors or the combination thereof, or other method to indicate the IC specification so as to facilitate the IC specification which has been placed on the loading tray.

Yet another object of the present invention is to provide an identification device for IC loading tray, wherein the mounted identification card will not be dislocated from the protruded edges at the side of the IC loading tray, and therefore the application of the identification device is simple.

Other object and advantages of the present invention will become more apparent from the following description taken in conjunction with the accompanying drawing.

DETAILED DESCRIPTION OF THE PREFERRED EMBODIMENT

Figure 1:
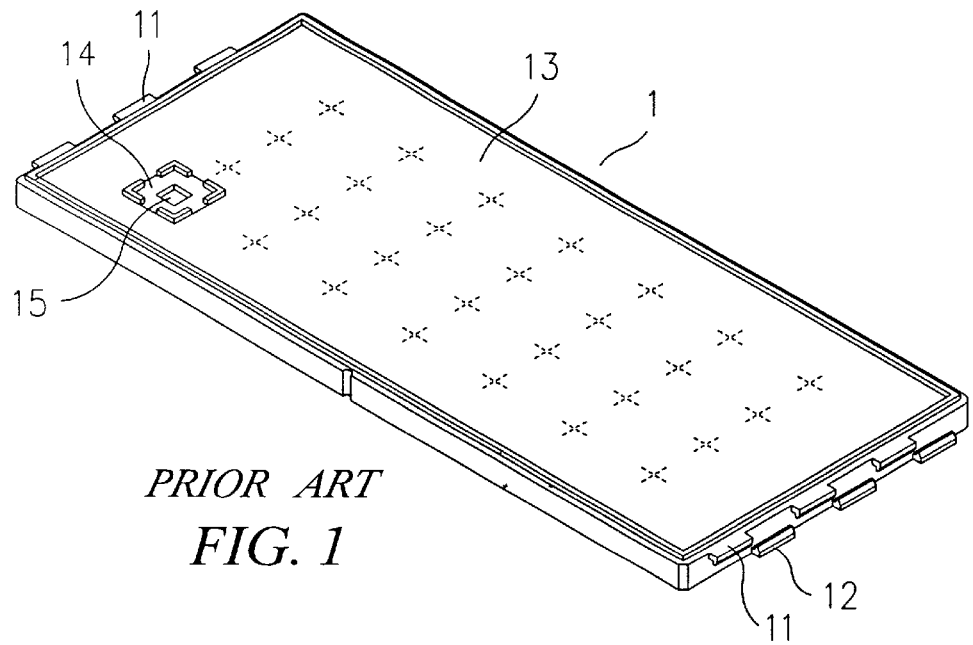
FIG. 1 is a perspective view of a conventional IC loading tray.
Figure 2:
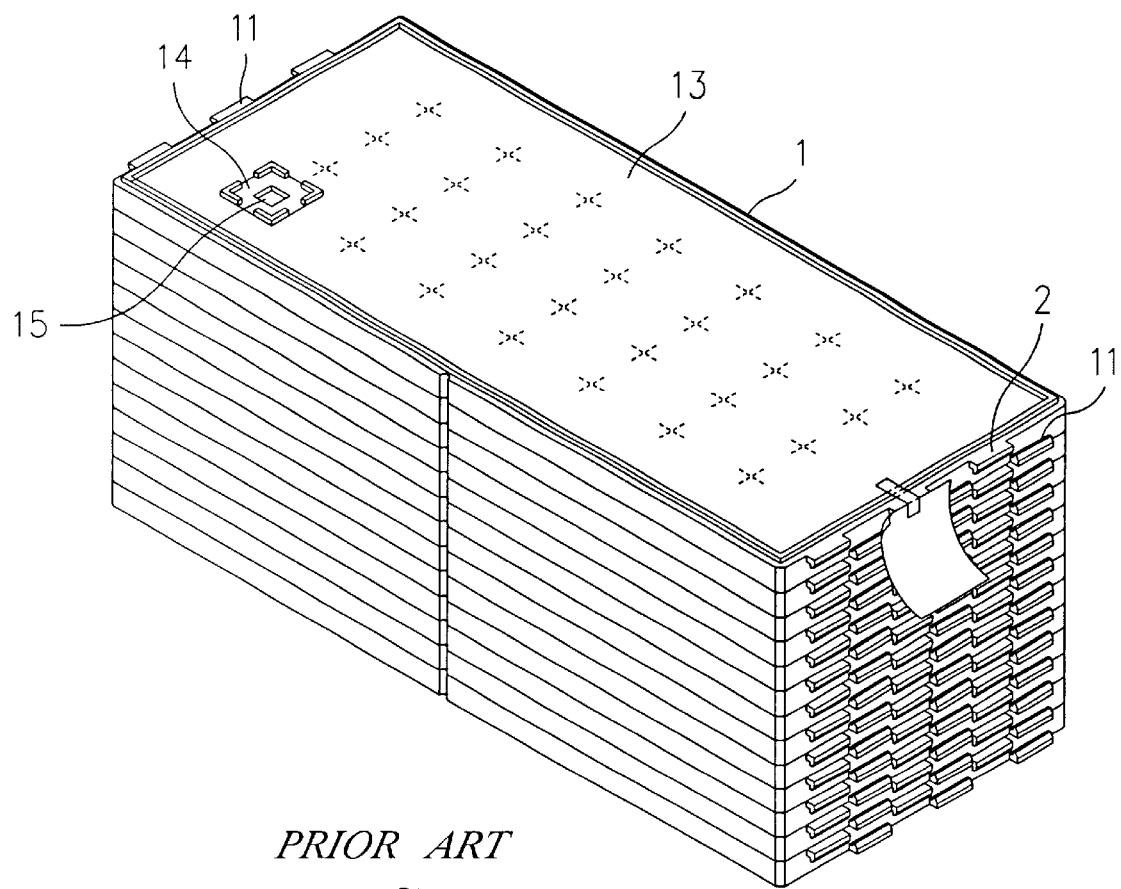
FIG. 2 is a schematic view showing the conventional marking/identification and the IC loading tray.
Figure 3:
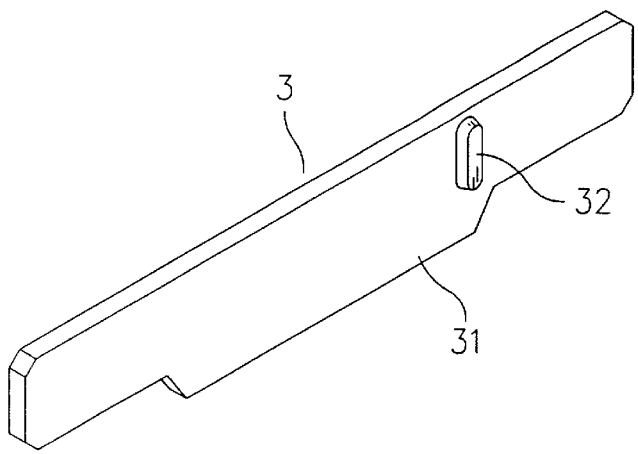
FIG. 3 is a perspective view of a preferred embodiment in accordance with the present invention.

Referring to FIG. 3, there is shove an identification device having an identification card 3 engaged at the lateral side of an IC loading tray 4. The identification card 3 is an elongated body made from plastic or rubber or other flexible material. The center of the lower side of the identification card 3 is provided with a protruded plate 31, and at the end face of the front side, close to the right side of the identification card 3 is provided with a protruded board 32. The individual corners of the identification card 3 are made into corners with inverted-hook like. In addition, the end face of the identification card 3 is coated with colors, or other written characters, or a combination of colors and words, or other methods, which can provide indication/marking of IC specification. By observing the marking/indication of the identification card 3, the IC specification can be easily identified/recognized.

Figure 4:
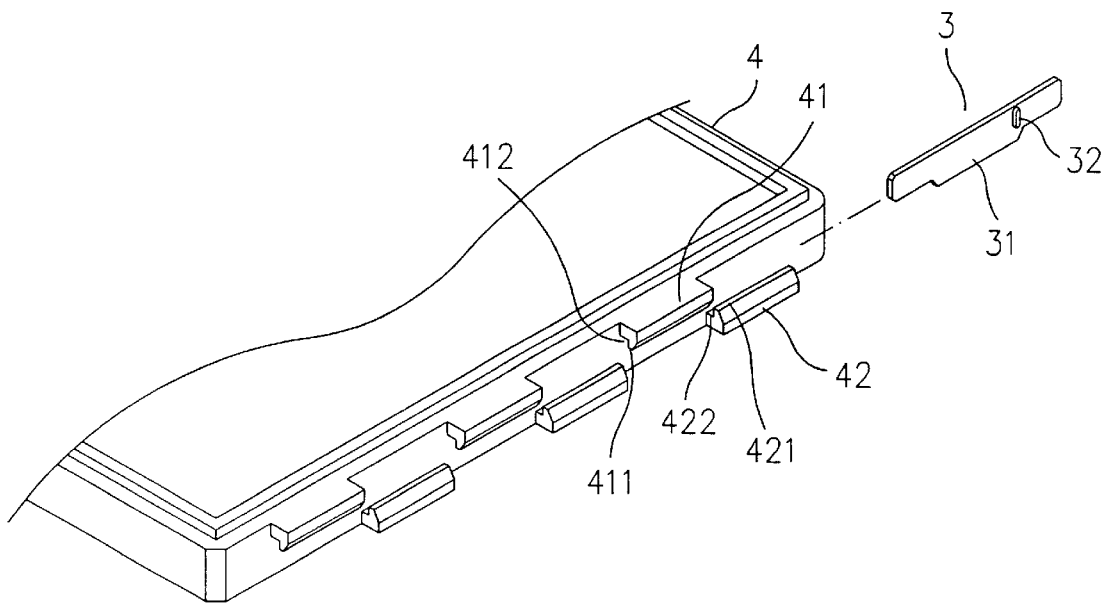
FIG. 4 is a schematic view of FIG. 3 before the identification card is mounted at the side of the IC loading tray in accordance with the present invention.

Referring to FIG. 4, one lateral side of the IC tray 4 is provided with a plurality of top protruded edges 41 and bottom protruded edges 42 arranged alternatively along the sides of the IC tray 4.

The end heads of the protruded edges 41, 42 are provided respectively with an inverted hook 411, 421 and the inner side of the inverted hooks 411, 421 are formed into elongated recess path 412, 422 of appropriate width. The width of the two elongated recess path 412, 422 is about the thickness of the identification card 3, and the thickness of the protruded plate 31 is smaller than the distance between two protruded edges 42.

Figure 5:
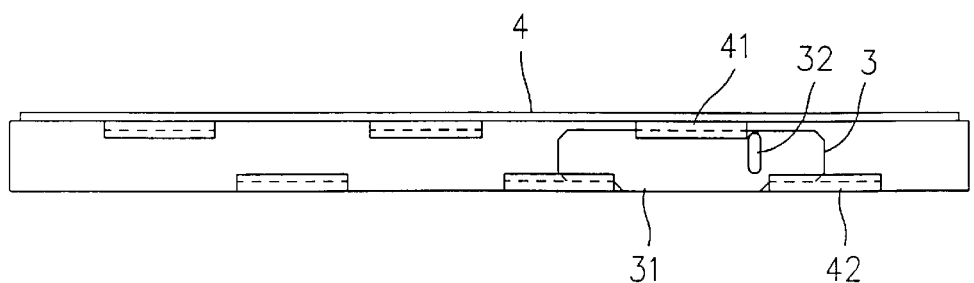
FIG. 5 is a schematic view of FIG. 3 after the identification card is mounted at the side of the loading tray in accordance with the present invention.

Referring to FIG. 5, when in application, the protruded board 32 of the identification card 3 is hold with hands, and the identification card 3 slides intact to the lateral side of the IC loading tray 4, such that the elongated recess path 412, 422 of the top protruded edge 41 and the bottom protruded edge 42 are pushed forward. As the identification card 3 is made from a soft material and the identification card 3 is provided with elasticity, and as the height of the identification card 3 is taller than that of the elongated recess path 412, 422, the combination effect of the elasticity and the inverted-hook like corners of the end corners, the identification card 3 can slide smoothly, and after the protruded board 32 is in engagement with the protruded edge 42, the identification card 3 is firmly secured.

Figure 6:
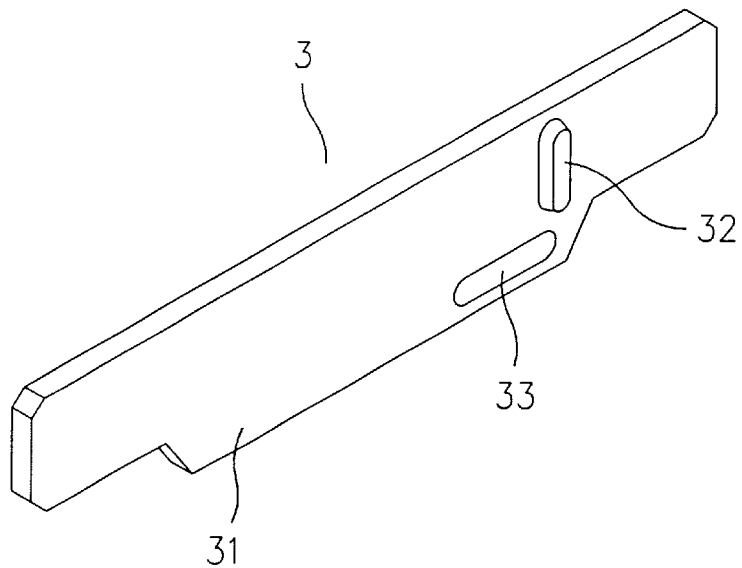
FIG. 6 is a preferred embodiment of FIG. 3 in accordance with the present invention.

As shown in FIG. 6, on the protruded plate 31, close to the bottom section of the protruded board 32, a long recess 33 is provided. As a result of the long recess 33, the protruded plate 31 is provided with better elasticity, which facilitates engagement and withdrawing movement.

Figure 7:
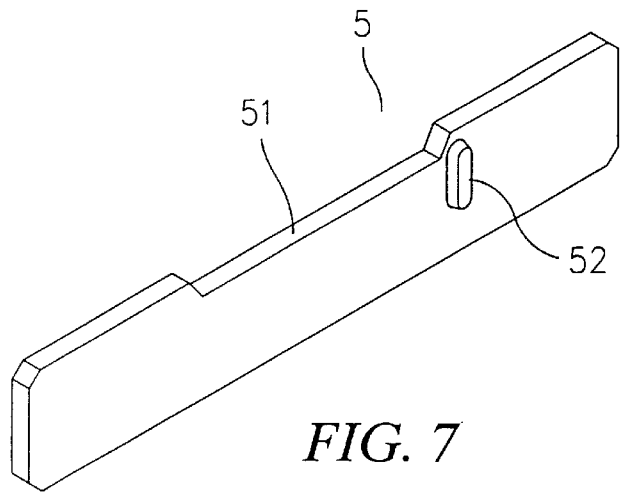
FIG. 7 is a perspective view of another preferred embodiment in accordance with the present invention.

Referring to FIG. 7, there is shown another preferred embodiment of the identification card 5 of the present invention. As shown in the figure, the identification card 5 is an elongated disc body made from plastic, rubber or other soft materials.

The center of the top lateral side is provided with a recess 51, arid the end face of the front side, right side of the recess 51, is provided with a board 52. The end corners of the identification card 5 are inverted. In addition, the end face of the identification card 5 is coated with colors, and is written with characters, or colors and combination with words, or others, which are sufficiently to provide markings or indication of IC specification, so that by observing the marking of the identification card 3, the IC specification can be directly obtained.

Figure 8:
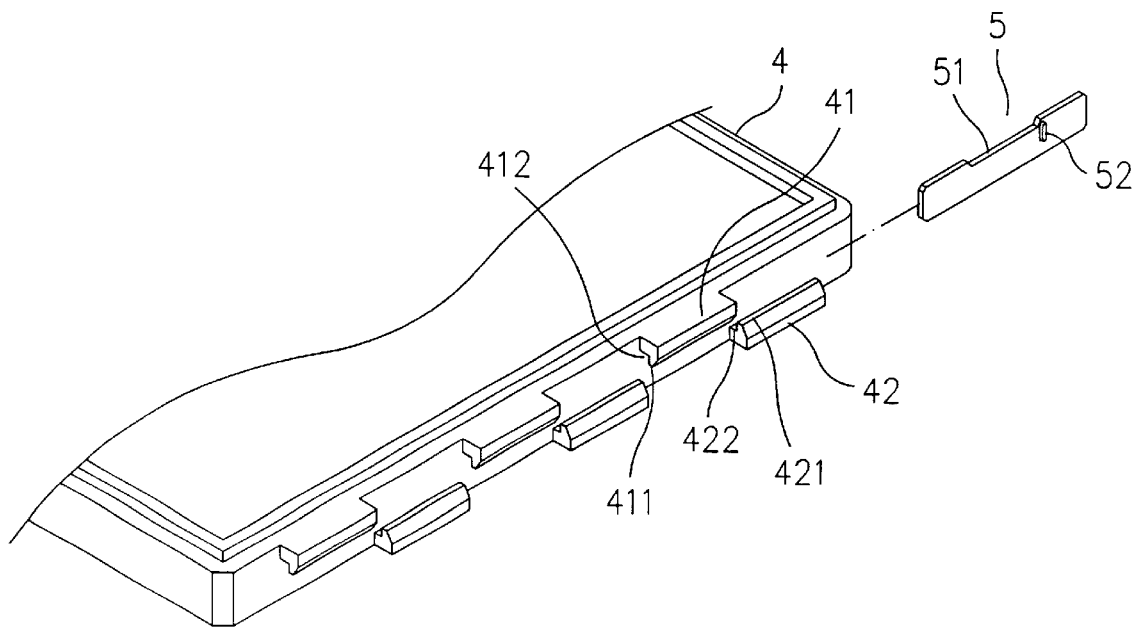
FIG. 8 is a schematic view of FIG. 7 before the identification card is mounted at the lateral side of IC loading tray in accordance with the present invention.

As shown in FIG. 8, the lateral sides of the IC loading tray 4 are provided alternatively with top protruded edges 41 and bottom protruded edges 42. The end head of the two protruded edges 41, 42 are provided respectively with an inverted hook 411, 421, such that the inner side of the inverted hooks 411, 421 form into an elongated recess path 412, 422 of appropriate width. The width of the two elongated recess path 412, 422 is substantially the thickness of the identification card 5, and the width of the recess 51 substantial equals to the width between the distance between two top protruded edges 41.

Figure 9:
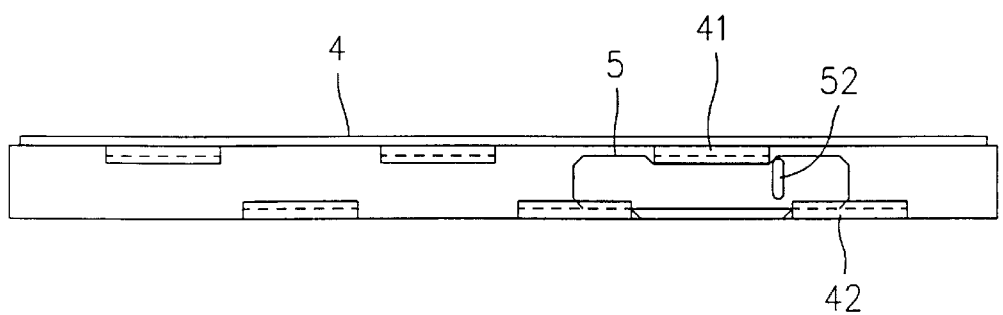
FIG. 9 is a schematic of FIG. 7 after it is mounted at the side of the IC loading tray.

In application, as shown in FIG. 9, when in application, the protruded board 52 of the identification card 5 is hold with hands, and the identification card 5 slides intact to the lateral side of the IC loading tray 4, such that the elongated recess path 412, 422 of the top protruded edge 41 and the bottom protruded edge 42 are pushed forward. As the identification card 5 is made from a soft material and the identification card 5 is provided with elasticity, and as the height of the identification card 5 is taller than that of the elongated recess path 412, 422, the combination effect of the elasticity and the inverted-hook like corners of the end corners, the identification card 5 can slide smoothly, and after the protruded board 52 is in engagement with the protruded edge 42, the identification card 5 is firmly secured.

Figure 10:
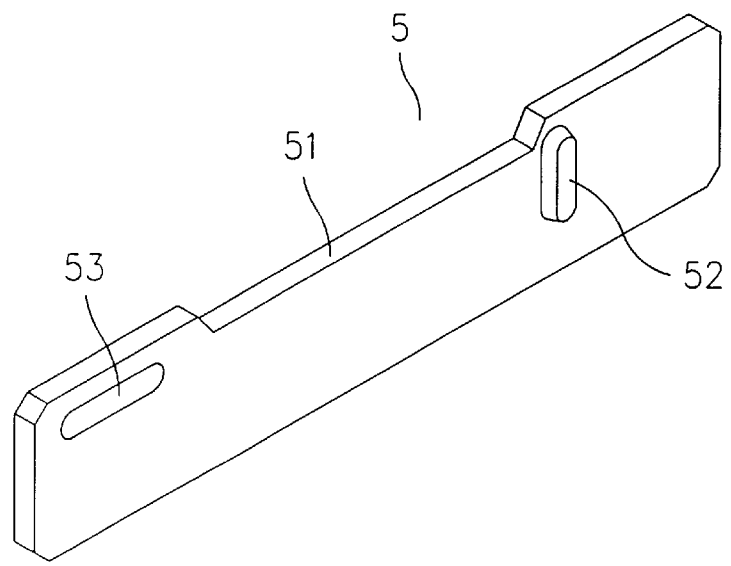
FIG. 10 is a preferred embodiment of FIG. 7 in accordance with the present invention.

Referring to FIG. 10, the higher end corner at the left lateral side of the identification card 5 is provided with a through long recess 53, and by means of the long recess 53, the end corner at the left side of the identification card 5 is provided with a better elasticity which facilitates a smooth engagement and withdrawing.

The effectiveness of the present invention is that after the identification card is engaged in between the top and bottom protruded edges of the IC loading tray, as a result of the coated colors, or written characters, or colors or the combinations thereof, the indication allows the observer to know/recognize the IC specification. Thus, the present invention provides an effective indication of IC specification on an IC loading tray. This improves the convenience of identification, and the positioning and withdrawing of the IC loading tray are proceeded by pushing the engagement card and withdrawing towards outside. The operation of the present invention is simple and the identification card is engaged at the top edge and bottom edge of the IC loading tray, and therefore, the identification card is located at a secured position and will not dislocate in the process of delivery or shipping of ICs.

While the invention has been described with respect to preferred embodiments, it will be clear to those skilled in the art that modifications and improvements may be made to the invention without departing from the spirit and scope of the invention. Therefore, the invention is not to be limited by the specific illustrative embodiments, but only by the scope of the appended claims.

I claim:

1. An identification device for IC loading tray having two corresponding lateral sides mounted with alternatively arranged top protruded edges and bottom protruded edges, characterized in that an identification card is mounted at the top and bottom edges and the identification card is an elongated plate body, wherein a center of a lower side of the body is provided with a protruded plate, and an end face of a front side of the body, close to a right side of the body, is provided with a protruded board, and the end face of the front side is provided with identification for IC specification.

2. An identification device for IC loading tray as set forth in claim 1, wherein a through recess is provided at the protruded plate of the identification card, close to the lower section of the protruded board.

3. An identification device for IC loading tray having two corresponding lateral sides mounted with alternatively arranged top protruded edges and bottom protruded edges, characterized in that an identification card is mounted at the top and bottom edges and the identification card is an elongated plate body, wherein a center of a top side of the body is provided with a recess, and a lateral side of an end face of the recess is provided with a protruded board, and an end face of a front side is provided with identification for IC specification.

4. An identification device for IC loading tray as set forth in claim 2, wherein a through recess is provided at a higher end corner at a left side of the identification card.

5. An identification device for IC loading tray as set forth in claim 1 or 2, wherein the identification at the end face of the identification card is coated with colors, or written characters, or the combination thereof, or other mode of indication.

* * * * *